(12) United States Patent
Zhu

(10) Patent No.: US 7,033,870 B1
(45) Date of Patent: Apr. 25, 2006

(54) SEMICONDUCTOR TRANSISTORS WITH REDUCED GATE-SOURCE/DRAIN CAPACITANCES

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,783

(22) Filed: Nov. 29, 2004

(51) Int. Cl.
*H01L 21/00* (2006.01)

(52) U.S. Cl. .................................... 438/158
(58) Field of Classification Search .............. 438/158, 438/159, 279
See application file for complete search history.

(56) References Cited

U.S. PATENT DOCUMENTS

| | | | | |
|---|---|---|---|---|
| 5,003,356 A | * | 3/1991 | Wakai et al. ............... | 257/390 |
| 5,038,184 A | * | 8/1991 | Chiang et al. .............. | 257/312 |
| 5,614,728 A | * | 3/1997 | Akiyama ..................... | 257/57 |
| 5,656,824 A | * | 8/1997 | den Boer et al. ............ | 257/59 |
| 6,197,624 B1 | * | 3/2001 | Yamazaki .................... | 438/158 |
| 6,246,070 B1 | * | 6/2001 | Yamazaki et al. ............ | 257/40 |
| 6,359,320 B1 | * | 3/2002 | Yamazaki et al. .......... | 257/408 |
| 6,429,059 B1 | * | 8/2002 | Yamazaki et al. .......... | 438/158 |
| 6,482,684 B1 | * | 11/2002 | Yamazaki .................... | 438/158 |
| 6,838,324 B1 | * | 1/2005 | Yamazaki et al. .......... | 438/149 |
| 6,906,385 B1 | * | 6/2005 | Moon et al. ................. | 257/347 |
| 2002/0068372 A1 | * | 6/2002 | Kunii .......................... | 438/30 |
| 2002/0130324 A1 | * | 9/2002 | Song et al. .................. | 257/72 |

* cited by examiner

*Primary Examiner*—Matthew Smith
*Assistant Examiner*—Lex H. Malsawma
(74) *Attorney, Agent, or Firm*—Steven Capella

(57) ABSTRACT

A novel semiconductor structure and method for forming the same. The semiconductor structure includes (a) a gate layer, (b) a gate dielectric layer on the gate layer, (c) a semiconductor layer on the gate dielectric layer. The semiconductor layer is electrically insulated from the gate layer by the gate dielectric layer. The semiconductor layer includes (i) first and second channel regions in direct physical contact with the gate dielectric layer and (ii) first, second, and third source/drain regions. The first channel region is disposed between and in direct physical contact with the first and second source/drain regions. The second channel region is disposed between and in direct physical contact with the second and third source/drain regions. The first, second, and third source/drain regions are directly on the gate layer.

15 Claims, 15 Drawing Sheets

SEMICONDUCTOR TRANSISTORS WITH REDUCED GATE-SOURCE/DRAIN CAPACITANCES

BACKGROUND OF THE INVENTION

1. Technical Field

The present invention relates to semiconductor structures, and more particularly, to semiconductor structures with reduced gate-source/drain capacitances.

2. Related Art

A typical semiconductor transistor comprises a channel region and first and second source/drain (S/D) regions formed in a semiconductor layer, wherein the channel region is disposed between the first and second S/D regions. The typical semiconductor transistor further comprises a gate stack (that includes a gate dielectric region directly on top the channel region and a gate region on top of the gate dielectric region) directly above the channel region. In addition, the typical semiconductor transistor further comprises first and second gate spacers on opposing side walls of the gate stack so as to define the first and second S/D regions, respectively. The capacitance between the gate region and the first S/D region has several components one of which is defined by a path from the gate region to the first S/D region through the first gate spacer. This capacitance component is usually referred to as the out-fringing capacitance. For example, the out-fringing capacitance between the gate region and the second S/D region is defined by a path from the gate region to the second S/D region through the second gate spacer.

It is desirable to eliminate the out-fringing capacitances between the gate region and the first and second S/D regions in order to increase transistor performance or to reduce transistor switching time. Therefore, there is a need for a novel transistor structure (and a method for forming the same) that does not have the out-fringing capacitances between the gate region and the first and second S/D regions.

SUMMARY OF THE INVENTION

The present invention provides a semiconductor structure, comprising (a) a gate layer; (b) a gate dielectric layer on the gate layer; (c) a semiconductor layer on the gate dielectric layer, wherein the semiconductor layer is electrically insulated from the gate layer by the gate dielectric layer, wherein the semiconductor layer comprises (i) first and second channel regions in direct physical contact with the gate dielectric layer and (ii) first, second, and third source/drain regions, wherein the first channel region is disposed between and in direct physical contact with the first and second source/drain regions, and wherein the second channel region is disposed between and in direct physical contact with the second and third source/drain regions.

The present invention also provides a semiconductor fabrication method, comprising the steps of (a) providing (i) a gate layer, (ii) a gate dielectric layer on the gate layer, and (iii) a semiconductor layer on the gate dielectric layer, wherein the semiconductor layer is electrically insulated from the gate layer by the gate dielectric layer; and (b) forming first, second, and third source/drain regions in the semiconductor layer such that a first channel region in the semiconductor layer is disposed between and in direct physical contact with the first and second source/drain regions, such that a second channel region in the semiconductor layer is disposed between and in direct physical contact with the second and third source/drain regions, and such that the first and second channel regions are in direct physical contact with the gate dielectric layer.

The present invention also provides a semiconductor fabrication method, comprising the steps of (a) providing a gate layer; (b) after step (a) is performed, forming a gate dielectric layer on the gate layer; (c) after step (b) is performed, forming a semiconductor layer on the gate dielectric layer, wherein the semiconductor layer is electrically insulated from the gate layer by the gate dielectric layer; and (d) forming first and second source/drain regions in the semiconductor layer such that a first channel region in the semiconductor layer is disposed between and in direct physical contact with the first and second source/drain regions.

The present invention also provides a novel transistor structure (and the method for forming the same) that does not have the out-fringing capacitances between the gate region and the first and second S/D regions of the transistor structure.

DETAILED DESCRIPTION OF THE INVENTION

Figure 1:
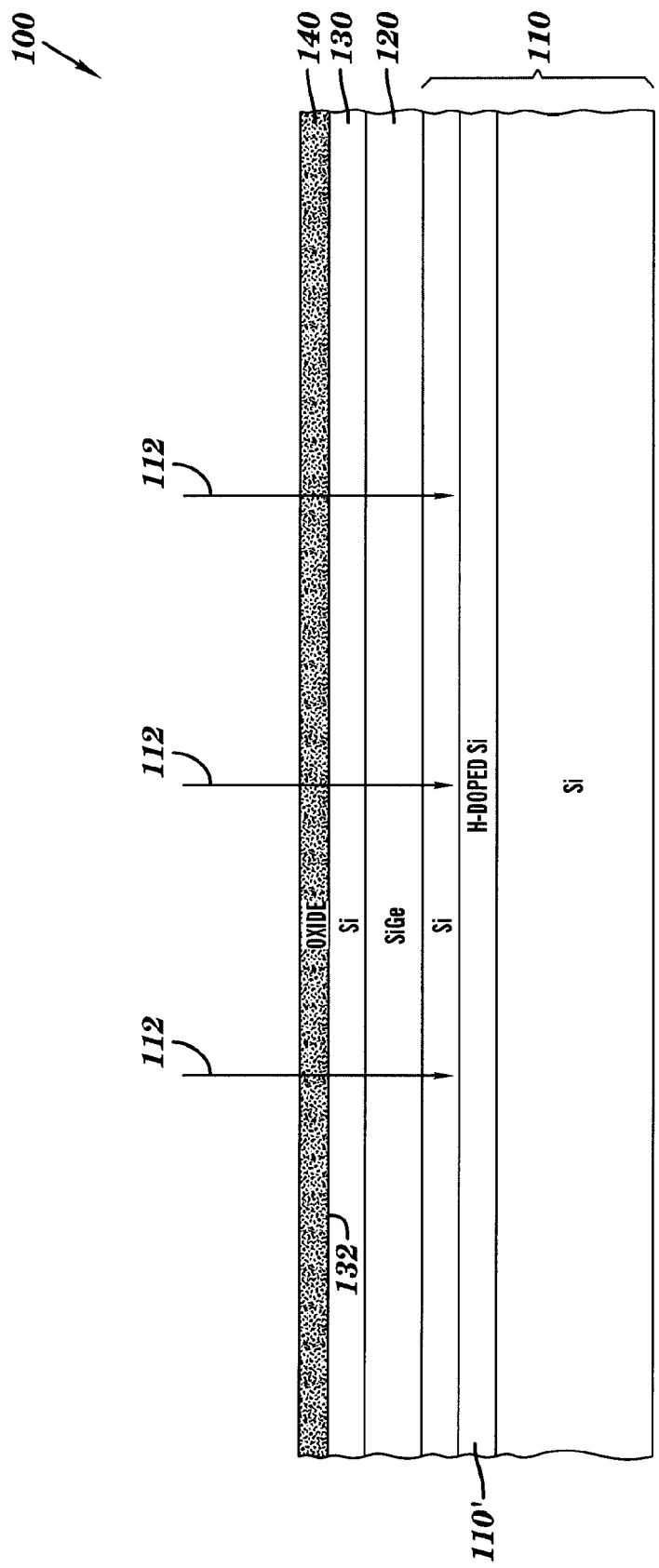
FIGS. 1–14 illustrate a semiconductor structure going through fabrication steps, in accordance with embodiments of the present invention.

FIGS. 1–14 illustrate a semiconductor structure 100 going through fabrication steps, in accordance with embodiments of the present invention. More specifically, with reference to FIG. 1, the fabrication of structure 100 can start out with a silicon layer 110.

Next, a thin SiGe (silicon-germanium) layer 120 can be epitaxially grown on top of the silicon layer 110. In one embodiment, the SiGe layer 120 can be around 10 nm thick with about 5%–10% germanium.

Next, a thin silicon layer 130 can be epitaxially grown on top of the SiGe layer 120. In one embodiment, the silicon layer 130 can be around 10 nm thick.

Next, a gate dielectric layer 140 can be formed on top of the silicon layer 130. In one embodiment, the gate dielectric layer 140 can be formed by thermally oxidizing a top surface 132 of the silicon layer 130.

Next, a hydrogen implant layer 110' can be formed in the silicon layer 110. In one embodiment, the hydrogen implant layer 110' can be formed by an ion implantation process represented by arrows 112 whose directions indicate the direction of hydrogen ion bombardment at a hydrogen ion energy that targets the layer 110'.

Figure 2:
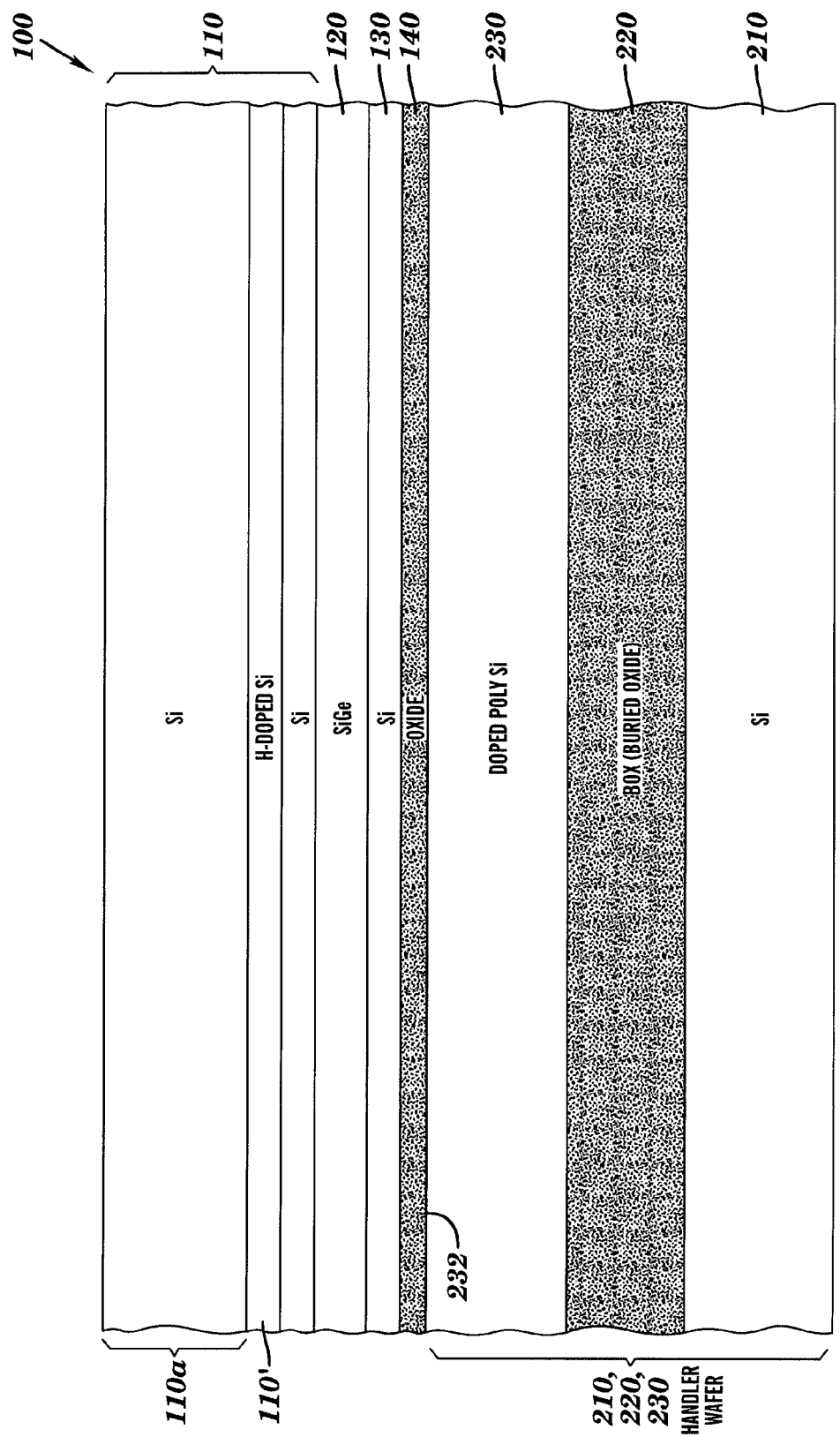

Next, with reference to FIG. 2, the structure 100 of FIG. 1 can be turned upside down and attached to a top surface 232 of a handler wafer 210,220,230. In one embodiment, the handler wafer 210,220,230 can comprise a silicon layer 210, a buried oxide (or any other dielectric material) layer 220 on top of the silicon layer 210, and a doped poly-silicon gate layer 230 on top of the buried oxide layer 220. The structure 100 of FIG. 1 can be attached to the handler wafer 210,220, 230 such that the gate dielectric layer 140 is in direct physical contact with the poly-silicon gate layer 230 of the handler wafer 210,220,230. The resulting structure can be referred to as the structure 100.

Next, a top portion 110a of the silicon layer 110 can be broken off the structure 100 of FIG. 2 along the hydrogen implant layer 110'. Next, the remainder of the silicon layer 110 (including the remainder of the hydrogen implant layer 110' after the top portion 110a of the silicon layer 110 breaks off) can be etched away essentially without affecting the SiGe layer 120. As a result, at this time, the SiGe layer 120 becomes a top layer of the structure 100.

Figure 3:
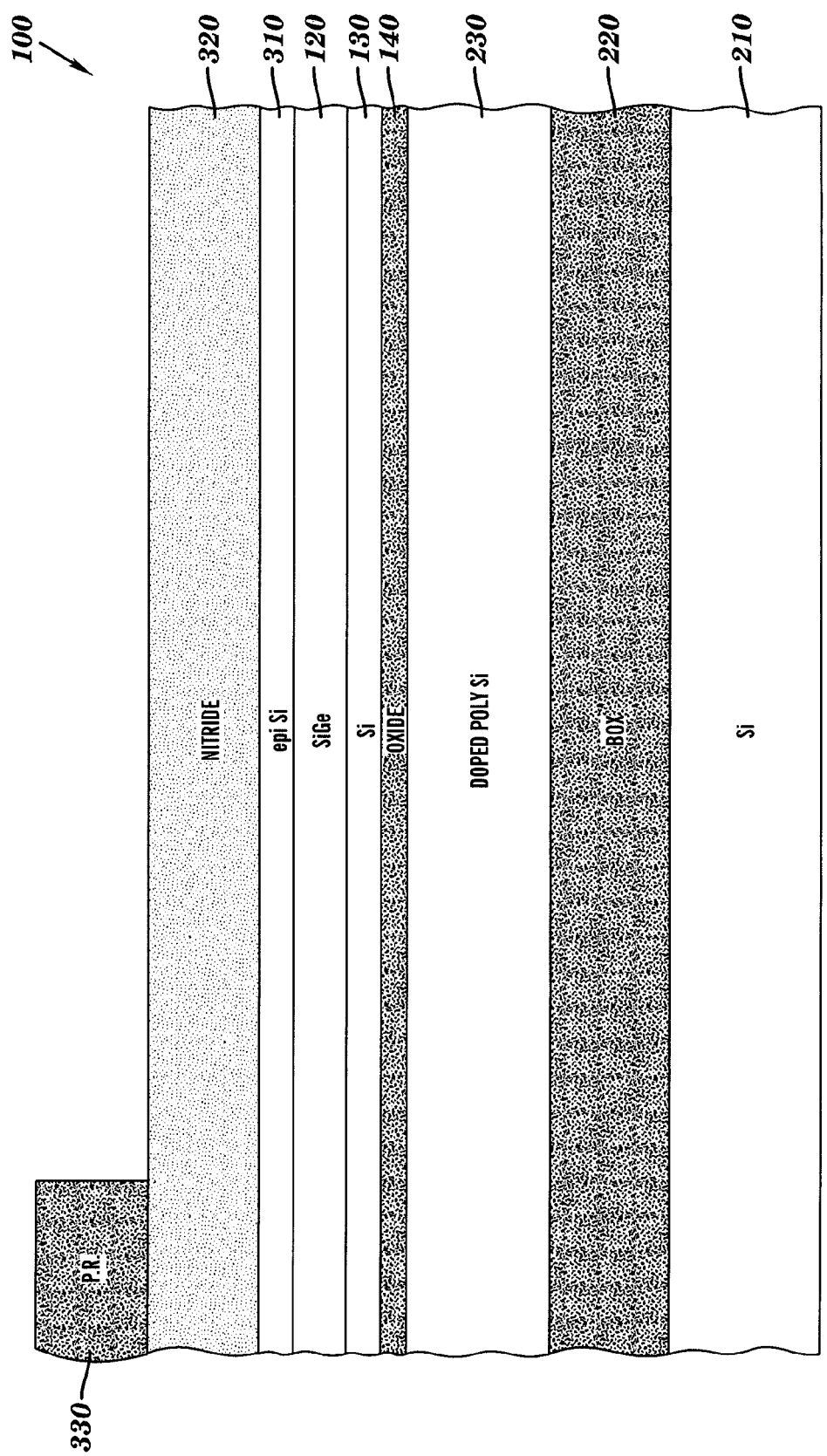
Figure 4:
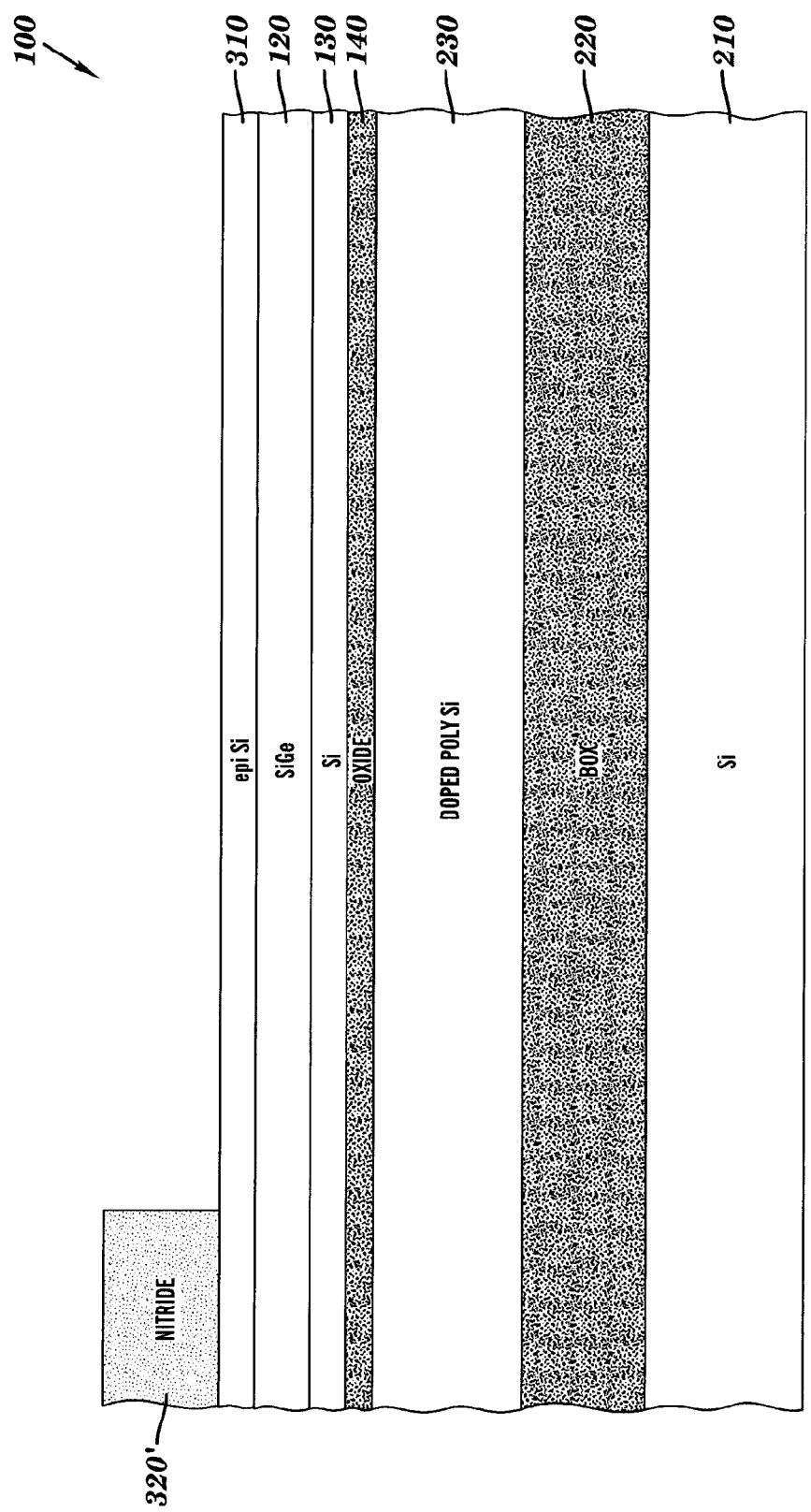

Next, with reference to FIG. 3, a silicon layer 310 can be epitaxially grown on top of the SiGe layer 120. Next, a nitride layer 320 can be formed on top of the silicon layer 310. Next, a patterned photoresist layer 330 can be formed on top of the nitride layer 320. Next, the patterned photoresist layer 330 can be used as a mask to etch the nitride layer 320 essentially without affecting the silicon layer 310, and then the patterned photoresist layer 330 can be removed. The resulting structure 100 is shown in FIG. 4. In one embodiment, the etching of the nitride layer 320 can be reactive ion etching (RIE). The nitride layer 320 of FIG. 3 is now reduced to the nitride region 320' of FIG. 4.

Figure 5:
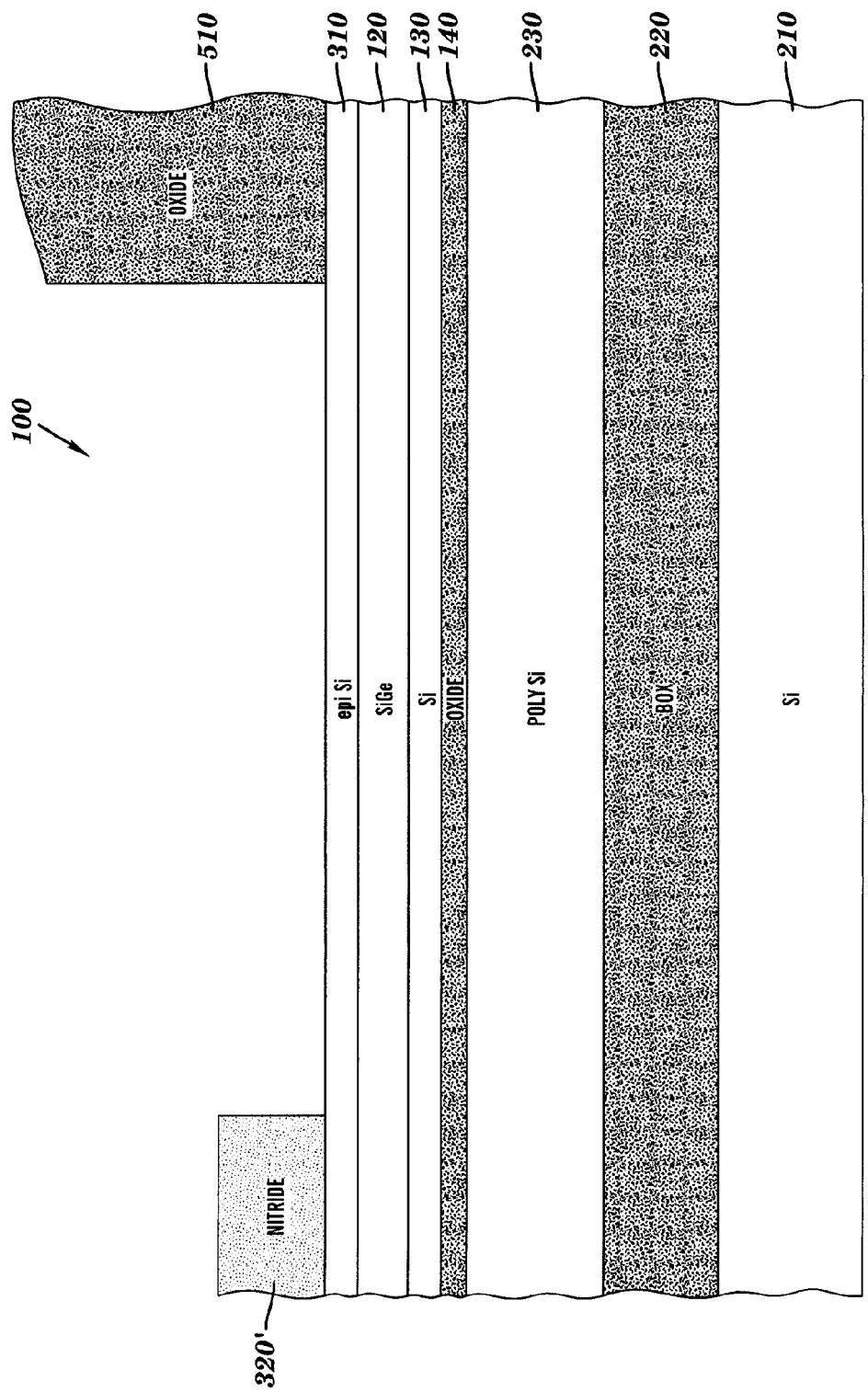

Next, with reference to FIG. 5, an oxide region 510 can be formed on top of the silicon layer 310. The oxide region 510 can be formed by, illustratively, lithography and then etching.

Figure 6:
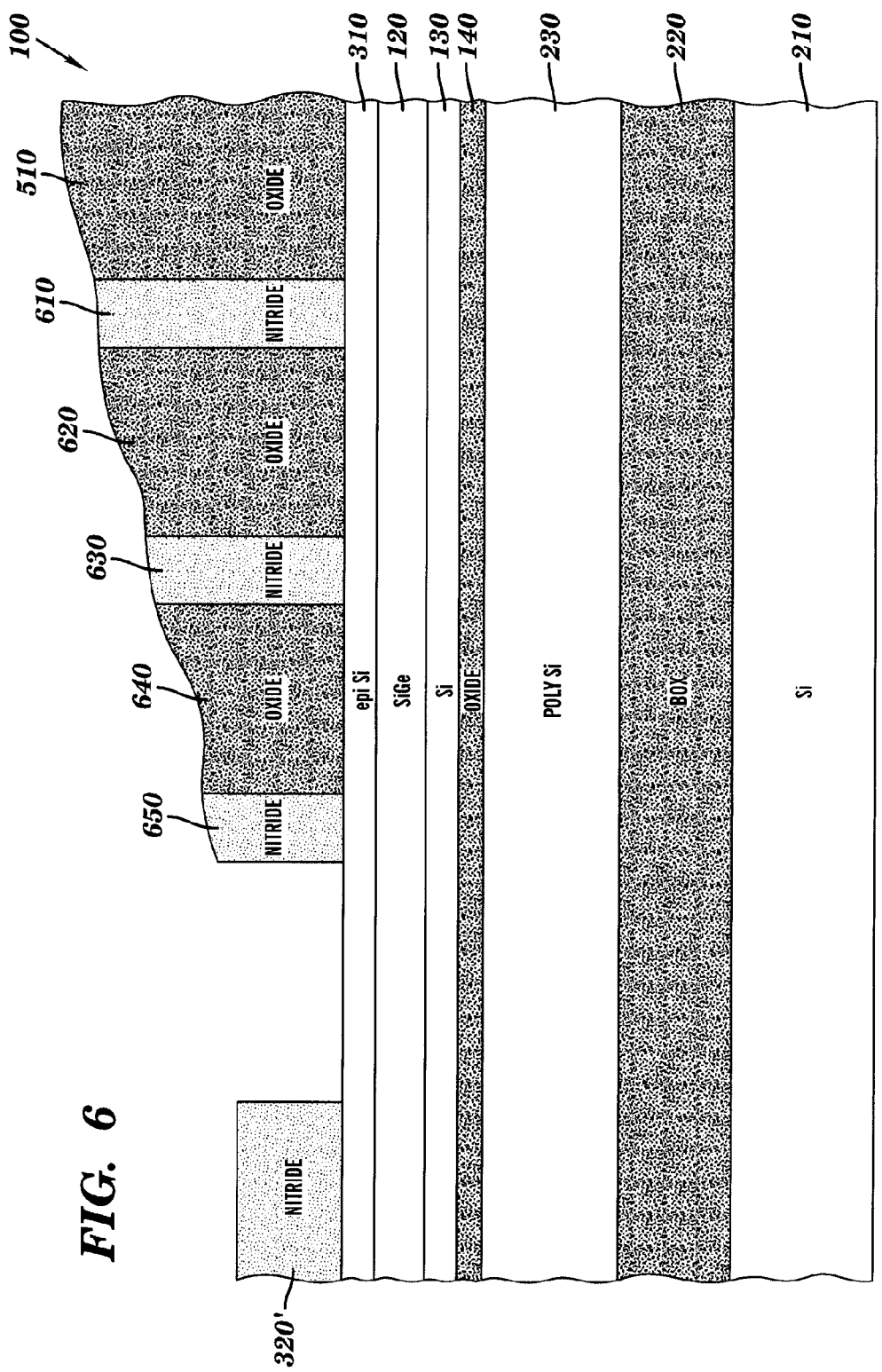

Next, with reference to FIG. 6, nitride and oxide regions 610, 620, 630, 640, and 650 can be formed in that order on top of the silicon layer 310. In one embodiment, each of the regions 610, 620, 630, 640, and 650 can be formed by forming a layer on top of the entire structure 100 and then etching back the newly formed layer. For instance, the nitride region 610 can be formed by depositing a nitride layer (not shown) on top of the entire structure 100 of FIG. 5 and then etching back the newly deposited nitride layer. As a result, the nitride region 610 is formed on a side wall of the oxide region 510. In one embodiment, the thickness of the nitride layer 320 of FIG. 3 is such that the region 320' is not completely removed due to the formations of the nitride regions 610, 630, and 650.

Figure 7:
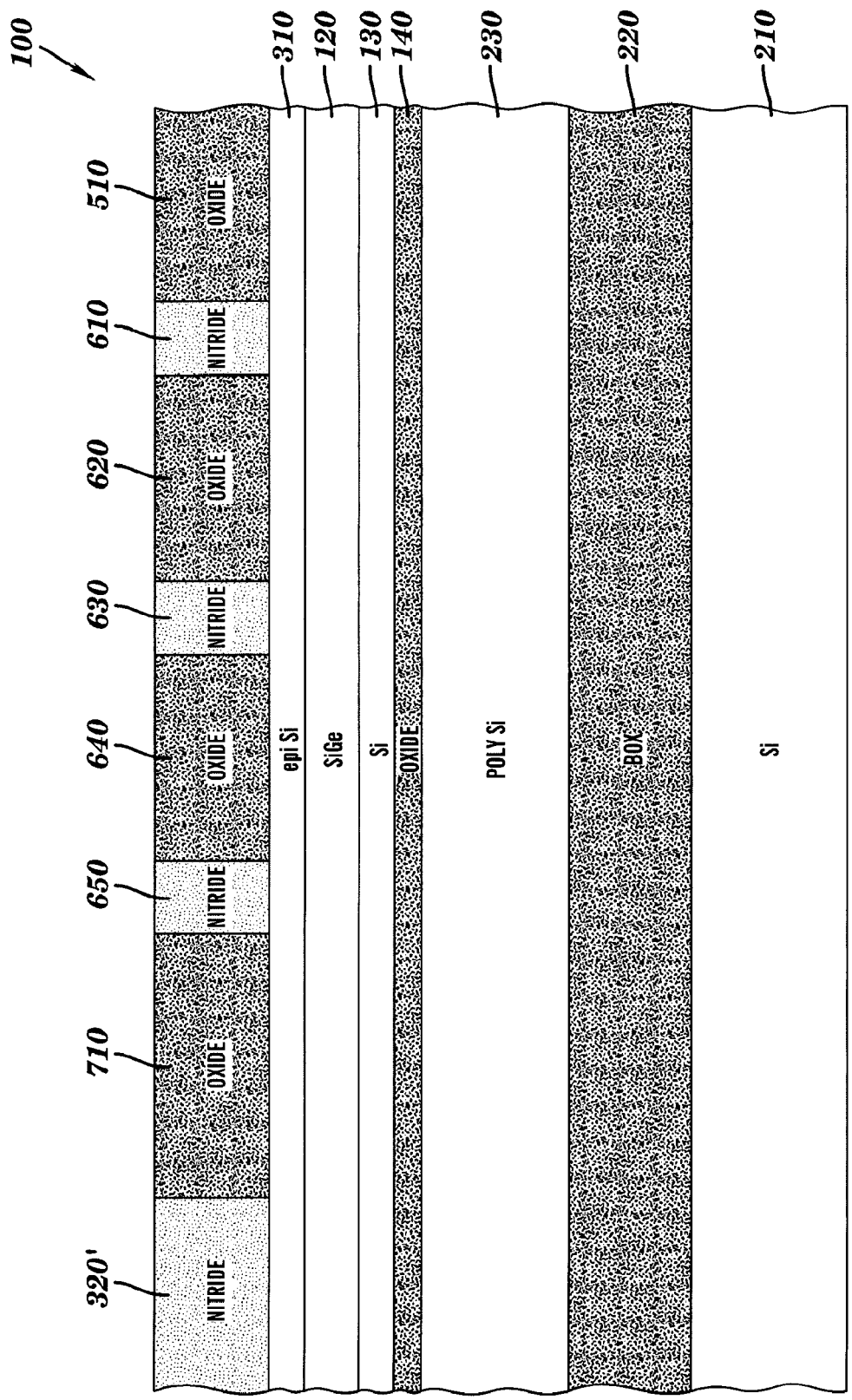

Next, an oxide layer (not shown) can be formed on top of the entire structure 100 of FIG. 6, and then a top surface (not shown) of the structure 100 can be polished by, illustratively, a CMP (chemical mechanical polishing) step. The resulting structure 100 is shown in FIG. 7. The remainder of the just formed oxide layer after the CMP step can be referred to as the oxide region 710 (FIG. 7).

Next, with reference to FIG. 7, the oxide regions 510, 620, 640, and 710 can be removed by, illustratively, a RIE step. Next, the nitride regions 610, 630, 650, and 320' can be used as a mask to etch the silicon layer 310 essentially without affecting the SiGe layer 120. The resulting structure 100 is shown in FIG. 8A.

Figure 8A:
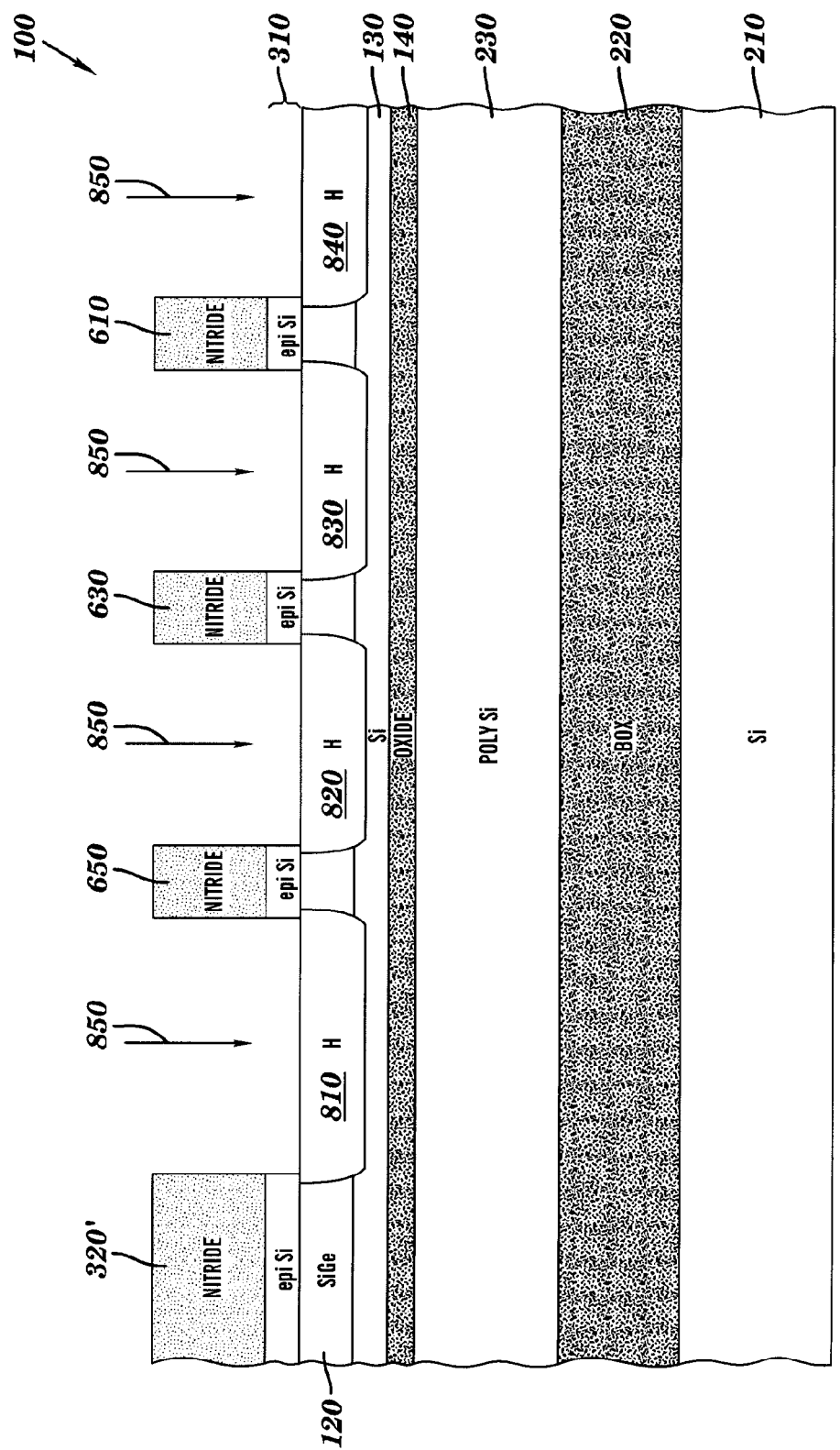

Next, with reference to FIG. 8A, the nitride regions 610, 630, 650, and 320' can be again used as a mask to implant halo regions 810, 820, 830, and 840 in the SiGe layer 120 and the silicon layer 130 using a halo implant step represented by arrows 850 whose direction indicates the direction of halo ion bombardment.

Figure 8B:
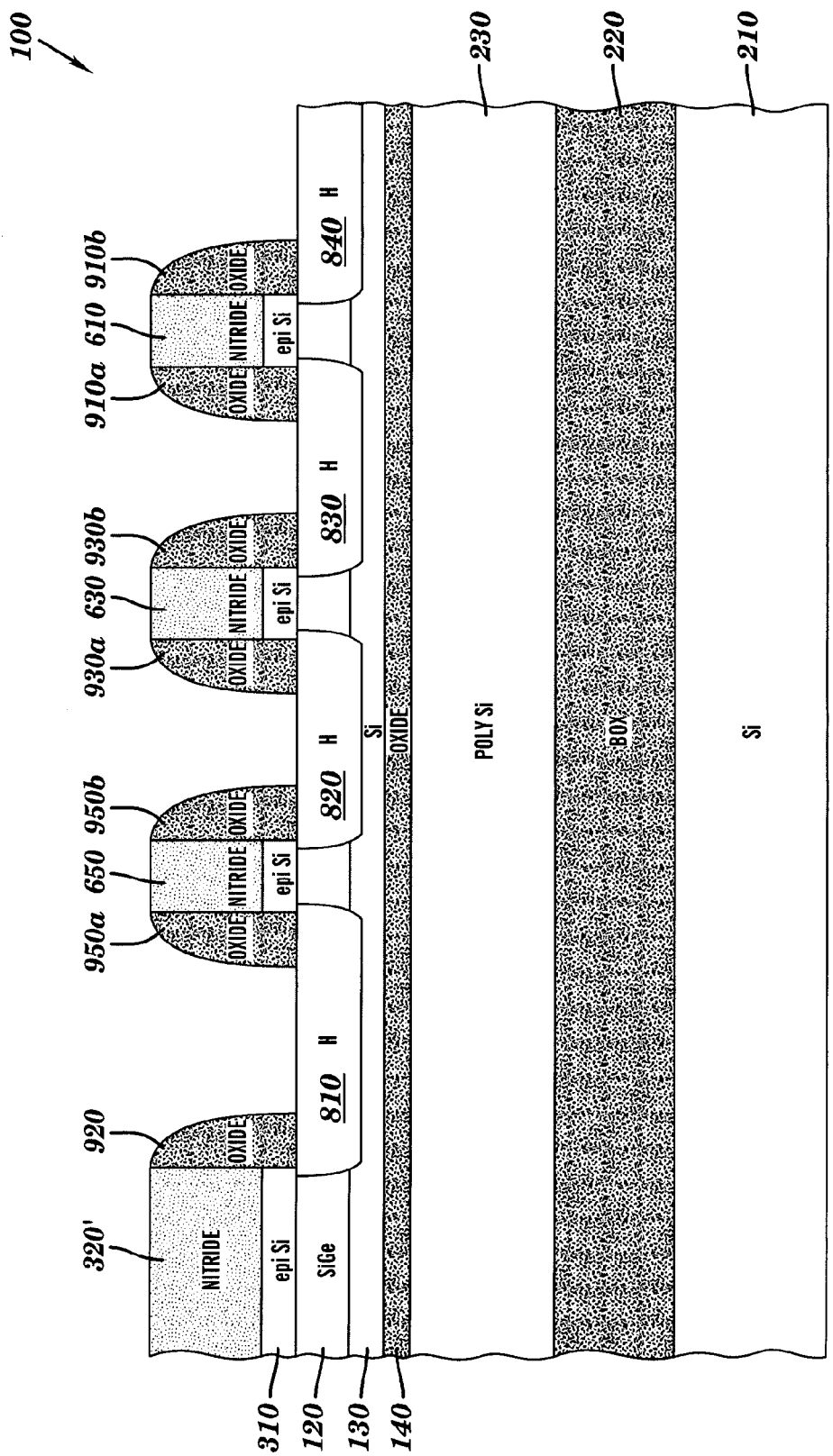

Next, an oxide layer (not shown) can be formed on top of the entire structure 100 of FIG. 8A and then etched back so as to form, with reference to FIG. 8B, oxide spacers 920, 950a, 950b, 930a, 930b, 910a, and 910b. With reference to FIG. 8B, more specifically, the oxide spacer 920 is formed on a side wall of the nitride region 320'. The oxide spacers 950a and 950b are formed on opposing side walls of nitride region 650. The oxide spacers 930a and 930b are formed on opposing side walls of nitride region 630. The oxide spacers 910a and 910b are formed on opposing side walls of nitride region 610.

The nitride region 320' and the oxide spacer 920 form a mask stack 320',920. The nitride region 650 and the oxide spacers 950a and 950b form a mask stack 650,950a,950b. The nitride region 630 and the oxide spacers 930a and 930b form a mask stack 630,930a,930b. The nitride region 610 and the oxide spacers 910a and 910b form a mask stack 610,910a,910b.

Next, the four mask stacks 320',920; 650,950a,950b; 630,930a,930b; and 610,910a,910b can be used to etch the SiGe layer 120 essentially without affecting the silicon layer 130. Next, the four mask stacks 320',920; 650,950a,950b; 630,930a,930b; and 610,910a,910b can be used again as a mask to implant, with reference to FIG. 9, extension regions 982, 984, 986, and 988 in the silicon layer 130. The extension implant step can be represented by arrows 990 whose direction indicates the extension ion bombardment.

Figure 9:
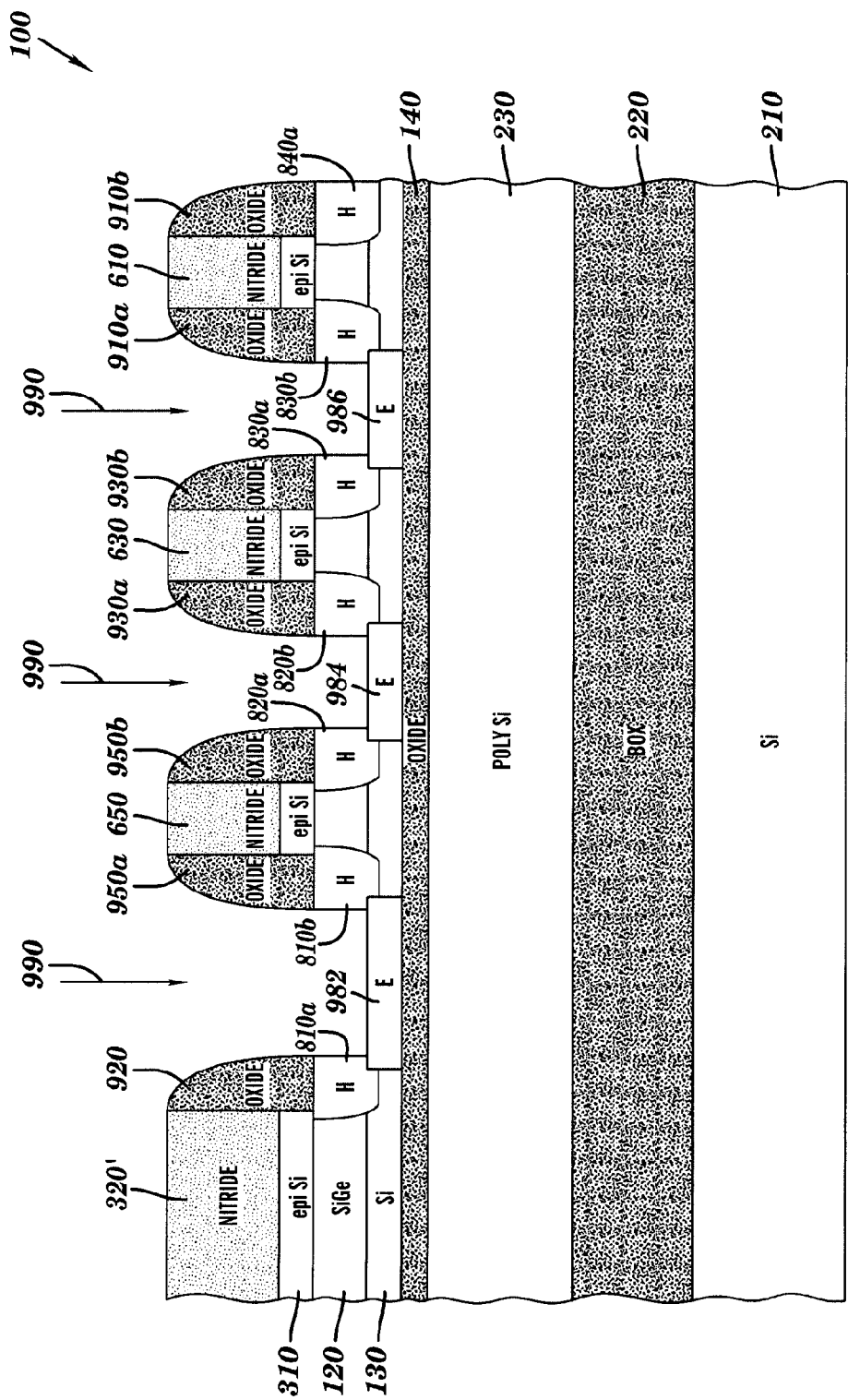
Figure 10:
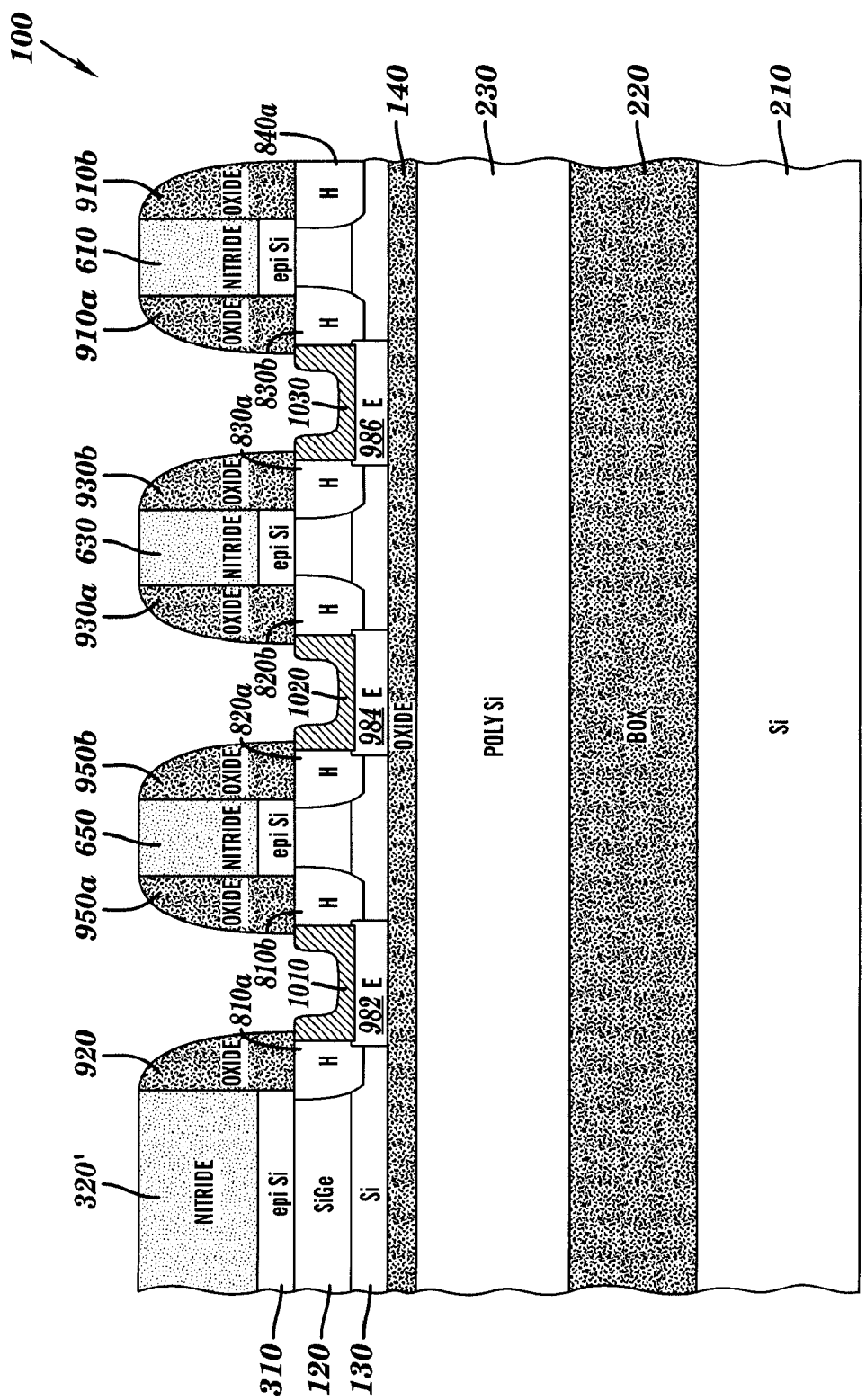

Next, with reference to FIG. 9, a thin metal (e.g., platinum) layer (not shown) can be formed on top of the entire structure 100 of FIG. 9. Next, the structure 100 can be subjected to a high temperature (annealing at ~300C–600C) such that platinum of the newly formed platinum layer chemically reacts with silicon of the silicon layer 310 and the SiGe layer 120 (where platinum and silicon are in direct physical contact) to form silicide regions 1010,1020, and 1030 (FIG. 10). Next, the rest of the platinum layer (which does not react with silicon) can be removed. The resulting structure 100 is shown in FIG. 10.

Next, with reference to FIG. 10, a tungsten (W) layer (not shown) can be formed on top of the entire structure 100 of FIG. 10 and then etched back so as to expose the silicide region 1010 (but not the silicide regions 1020 and 1030) to the atmosphere. This is feasible if the formations of the nitride regions 610, 630, and 650 (back in FIG. 6) are such that the horizontal distance between the nitride regions 320' and 650 is larger than the horizontal distance between the nitride regions 650 and 630 and is also larger than the horizontal distance between the nitride regions 630 and 610. As a result, the tungsten layer may be formed thicker directly above the silicide regions 1020 and 1030 than directly above the silicide region 1010.

Figure 11:
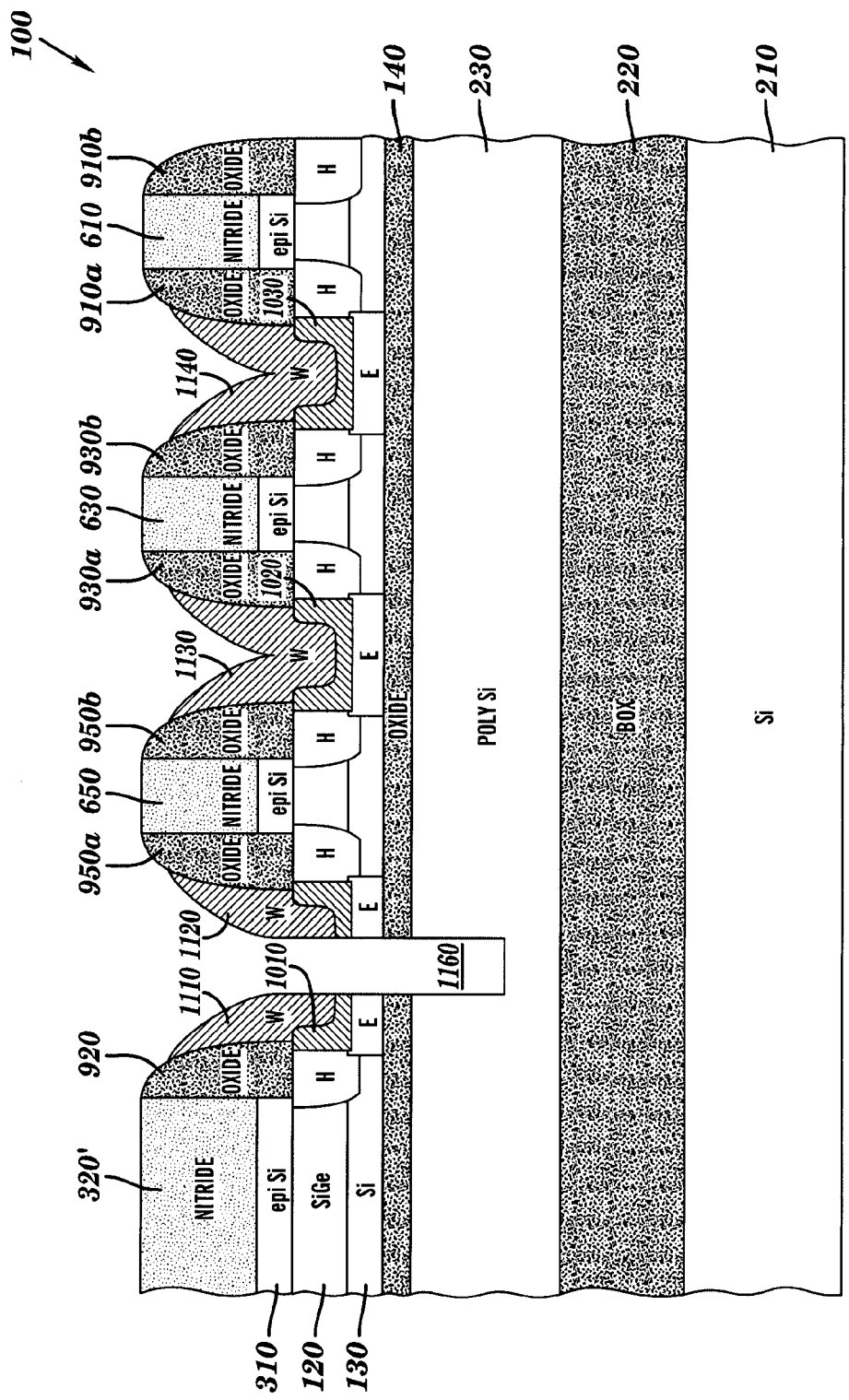

As a result, with reference to FIG. 11, tungsten spacers 1110 and 1120 are formed on side walls of the oxide spacers 920 and 950a, respectively. Also as a result, tungsten regions 1130 and 1140 are left completely covering the silicide regions 1020 and 1030, respectively.

Next, the four mask stacks 320',920; 650,950a,950b; 630,930a,930b; and 610,910a,910b, the tungsten spacers 1110 and 1120, and the tungsten regions 1130 and 1140 can be used as a mask to etch in turn through the silicide region 1010, the silicon layer 130, the gate dielectric layer 140, and a portion of the poly-silicon gate layer 230 so as to form a trench 1160.

Figure 12:
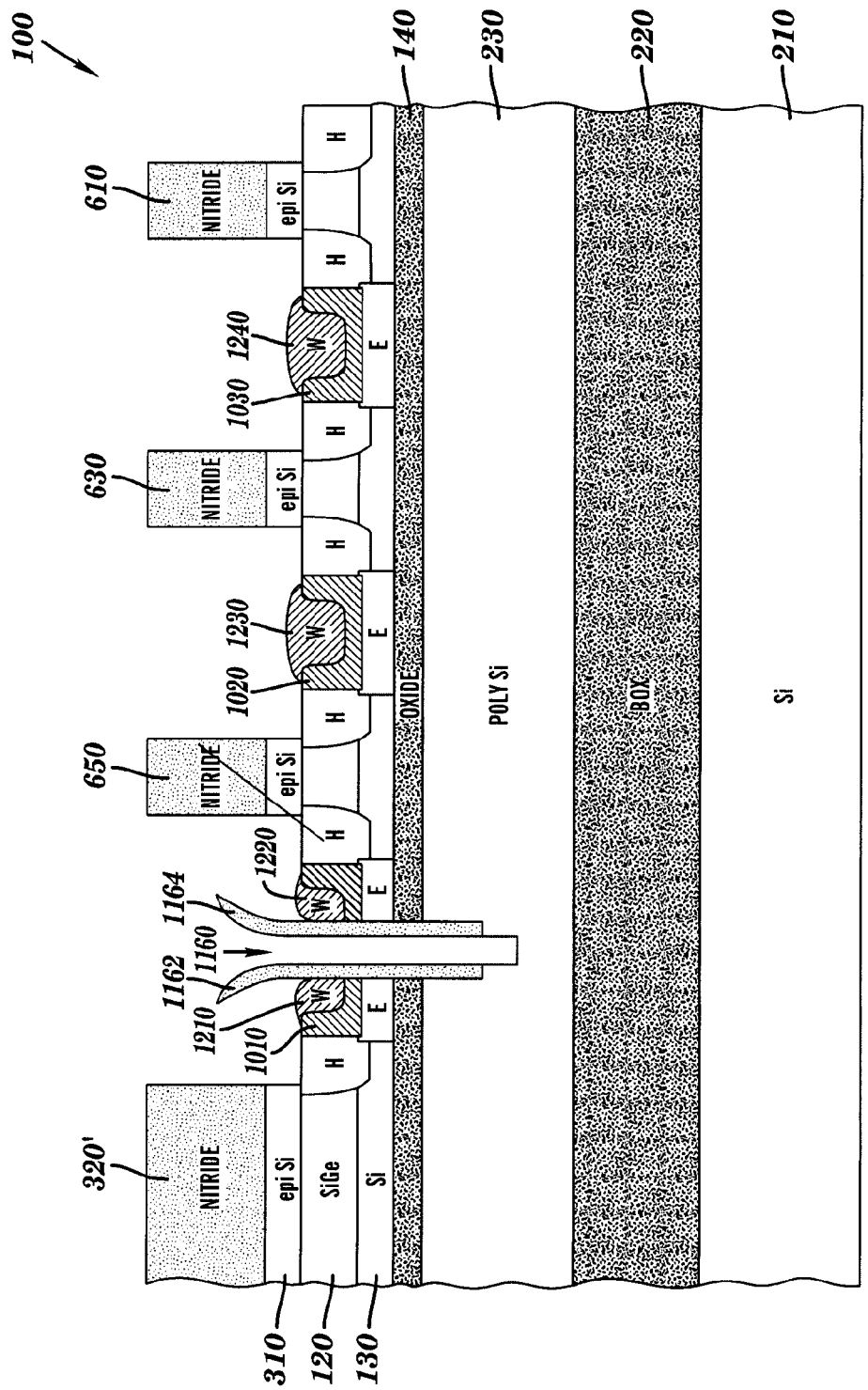

Next, a thin nitride layer (not shown) can be formed on top of the entire structure 100 of FIG. 11 and then etched back so as to form nitride spacers 1162 and 1164 (FIG. 12) on side walls of the trench 1160. Next, the oxide regions 920, 950a, 950b, 930a, 930b, 910a, and 910b can be removed. Next, the tungsten spacers 1110 and 1120 and the tungsten regions 1130 and 1140 can be partially etched so as to form tungsten regions 1210,1220, 1230, and 1240, respectively (FIG. 12). The resulting structure 100 is shown in FIG. 12.

Next, with reference to FIG. 12, the nitride spacers 1162 and 1164 and the nitride regions 610, 630, 650, and 320' can be removed by, illustratively, a wet etching process. Next, nitride spacers 1362 and 1364 (FIG. 13) are formed on side walls of the trench 1160 using any conventional process (e.g., blanket deposition and then etching back). Next, the silicon layer 310 of FIG. 12 can be removed by, illustratively, a RIE process which also makes the trench 1160 deeper (FIG. 13).

Figure 13:
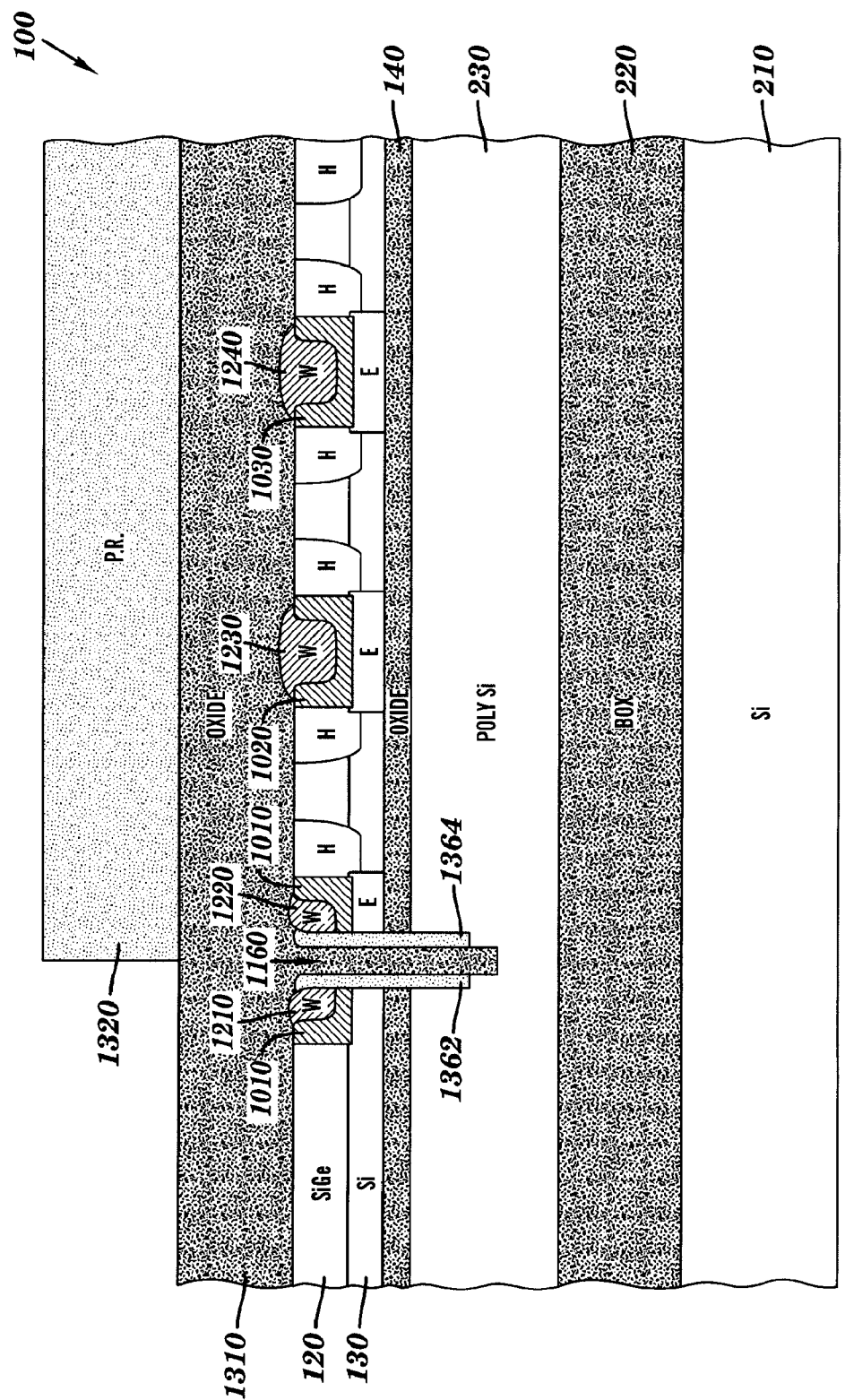

Next, with reference to FIG. 13, an oxide layer 1310 can be formed on top of the entire structure 100. Then, a patterned photoresist layer 1320 can be formed on top of the oxide layer 1310. The resulting structure 100 after the patterned photoresist layer 1320 is formed is shown in FIG. 13.

Figure 14:
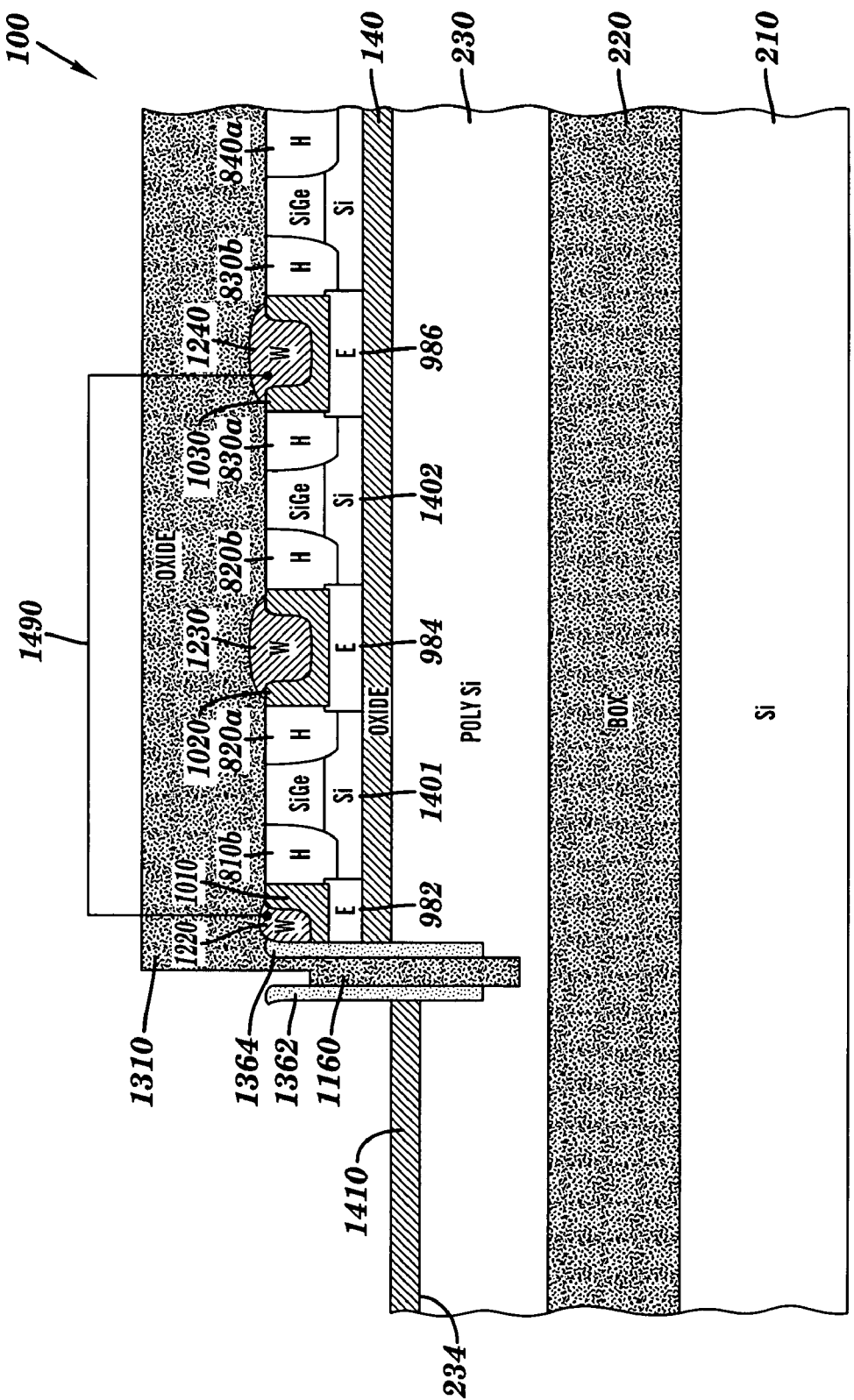

Next, the patterned photoresist layer 1320 can be used as a mask to etch through, in turn, the oxide layer 1310, the tungsten region 1210, the silicide region 1010, the SiGe layer 120, the silicon layer 130, and the gate dielectric layer 140. Next, the patterned photoresist layer 1320 can be removed. Then, with reference to FIG. 14, a gate contact region 1410 can be formed at the exposed-to-the-atmosphere surface 234 of the poly-silicon gate layer 230. The resulting structure 100 after the gate contact region 1410 is formed is shown in FIG. 14. In one embodiment, the gate contact region 1410 can be formed by (i) blanket-depositing a metal on top of the entire structure 100, (ii) annealing, and (iii) removing the residual metal.

In FIG. 14, there are at least first, second, and third source/drain (S/D) regions. The first S/D region can comprise the tungsten region 1220, the silicide region 1010, and the extension region 982. The second S/D region can comprise the tungsten region 1230, the silicide region 1020, and the extension region 984. The third S/D region can comprise the tungsten region 1240, the silicide region 1030, and the extension region 986. There are at least first and second channel regions 1401 and 1402, respectively.

As a result, there are at least first and second transistors in the structure 100 of FIG. 14. The first transistor can have the first and second S/D regions as its two S/D regions, have the first channel region 1401 as its channel region, have the gate dielectric layer 140 as its gate dielectric, and have the poly-silicon gate layer 230 as its gate region. The second transistor can have the second and third S/D regions as its two S/D regions, have the second channel region 1402 as its channel region, have the gate dielectric layer 140 as its gate dielectric, and have the poly-silicon gate layer 230 as its gate region. In other words, the first and second transistors share the same gate dielectric layer 140, the same gate layer 230, and a same S/D region (the second S/D region).

It should be noted that there is no out-fringing capacitance between the first, second, and third S/D regions and the gate region 230. For instance, with reference to the second S/D region, there is no path going from the tungsten region 1230 to the poly-silicon gate layer 230 that goes through a gate spacer as in the prior art (i.e., out-fringing capacitance does not exist).

In one embodiment, the first and third source/drain regions of the first and second transistors, respectively, are electrically coupled together via an electrically conducting line represented by a line 1490 in FIG. 14.

In the embodiments described above, for simplicity, specific materials (i.e., silicon, oxide, nitride, tungsten, platinum, etc.) are used in different layers and regions of the structure 100. In general, any equivalent materials can be used. For example, tantalum instead of platinum can be used in forming the silicide regions 1010, 1020, and 1030 (FIG. 10).

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor fabrication method, comprising the steps of:
    (a) providing (i) a gate layer, (ii) a gate dielectric layer on the gate layer, and (iii) a semiconductor layer on the gate dielectric layer, wherein the semiconductor layer is electrically insulated from the gate layer by the gate dielectric layer;
    (b) selectively implanting ions in the semiconductor layer so as to form first and second halo regions in the semiconductor layer, wherein the first and second halo regions comprise said ions; and
    (c) forming first, second, and third source/drain regions in the semiconductor layer, wherein the first halo region is in direct physical contact with the first source/drain region, and wherein the second halo region is in direct physical contact with the second source/drain region, and
        such that a first channel region in the semiconductor layer is disposed between and in direct physical contact with the first and second source/drain regions,
        such that a second channel region in the semiconductor layer is disposed between and in direct physical contact with the second and third source/drain regions, and
        such that the first and second channel regions are in direct physical contact with the gate dielectric layer.

2. The method of claim 1 wherein step (a) is performed such that the gate dielectric layers is on a buried dielectric layer.

3. The method of claim 1, wherein the step of forming the first, second, and third source/drain regions comprises the step of forming first, second, and third extension regions in the first, second, and third source/drain regions, respectively; and
    wherein the first and second extension regions are in direct physical contact with the first channel region.

4. The method of claim 3, wherein the step of forming the first source/drain region further comprises the step of forming a silicide region in the semiconductor layer, wherein the silicide region is in direct physical contact with the first extension region.

5. The method of claim 1, wherein step (c) is performed such that the first and third source/drain regions are electrically coupled together.

6. A semiconductor fabrication method, comprising the steps of:
    (a) providing a gate layer;
    (b) after step (a) is performed, forming a gate dielectric layer on the gate layer;
    (c) after step (b) is performed, forming a semiconductor layer on the gate dielectric layer, wherein the semiconductor layer is electrically insulated from the gate layer by the gate dielectric layer; and
    (d) forming first and second source/drain regions in the semiconductor layer,
        wherein the step of forming the first and second source/drain regions comprises the step of forming first and second extension regions in the first and second source/drain regions, respectively,
        such that a first channel region in the semiconductor layer is disposed between and in direct physical contact with the first and second extension regions of the first and second source/drain regions, respectively, and such that the second source/drain region is disposed between and in direct physical contact with the first channel region and a second channel region in the semiconductor layer.

7. The method of claim 6, further comprising the step of:
   forming first, second, and third mask regions on the semiconductor layer; and
   using the first, second, and third mask regions as a mask to selectively implant ions in the semiconductor layer so as to form first and second halo regions in the semiconductor layer, wherein the first and second halo regions comprise said ions.

8. The method of claim 7, wherein the first, second, and third mask regions comprise a nitride material.

9. The method of claim 6, wherein the step of forming the first and second extension regions comprises the step of:
   forming first, second, and third mask stacks on the semiconductor layer; and
   using the first, second, and third mask stacks as a mask to implant the first and second extension regions in the semiconductor layer.

10. The method of claim 9, wherein the step of forming the first, second, and third mask stacks comprises the step of forming spacers on two opposite side walls of each of first, second, and third mask regions, respectively, so as to form the first, second, and third mask stacks from the first, second, and third mask regions, respectively.

11. The method of claim 10, wherein the spacers comprise an oxide material.

12. The method of claim 9, wherein step (d) further comprises the step of forming first and second silicide contact regions on and in direct physical contact with the first and second extension regions, respectively.

13. The method of claim 12, wherein step (d) further comprises the step of forming first and second metal regions on and in direct physical contact with the first and second silicide contact regions, respectively.

14. The method of claim 13, wherein the first and second metal regions comprise tungsten.

15. The method of claim 6, further comprising the step of forming a third source/drain region in the semiconductor layer, wherein the step of forming the third source/drain region comprises the step of forming a third extension region in the third source/drain region
   such that the second channel region in the semiconductor layer is disposed between and in direct physical contact with the second and third extension regions of the second and third source/drain regions, respectively.

* * * * *

UNITED STATES PATENT AND TRADEMARK OFFICE
CERTIFICATE OF CORRECTION

PATENT NO. : 7,033,870 B1 Page 1 of 1
APPLICATION NO. : 10/904783
DATED : April 25, 2006
INVENTOR(S) : Zhu It is certified that error appears in the above-identified patent and that said Letters Patent is hereby corrected as shown below:

<u>Column 6</u>
Line 30, delete "gate dielectric layers" and insert -- gate dielectric layer --

<u>Column 7</u>
Lines 5 and 16, delete "step" and insert -- steps --

Signed and Sealed this

Eleventh Day of July, 2006

JON W. DUDAS
*Director of the United States Patent and Trademark Office*